(12) United States Patent
Galy et al.

(10) Patent No.: US 8,907,373 B2
(45) Date of Patent: Dec. 9, 2014

(54) ELECTRONIC DEVICE FOR PROTECTING FROM ELECTROSTATIC DISCHARGE

(71) Applicant: STMicroelectronics S.A., Montrouge (FR)

(72) Inventors: Philippe Galy, La Touvet (FR); Jean Jimenez, Saint Theoffrey (FR); Johan Bourgeat, Allevard (FR); Boris Heitz, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/628,614

(22) Filed: Sep. 27, 2012

(65) Prior Publication Data

US 2013/0113017 A1    May 9, 2013

(30) Foreign Application Priority Data

Nov. 3, 2011 (FR) ..................... 11 59951

(51) Int. Cl.
| | | |
|---|---|---|
| *H01L 29/74* | (2006.01) | |
| *H01L 31/111* | (2006.01) | |
| *H01L 29/788* | (2006.01) | |
| *H01L 23/62* | (2006.01) | |
| *H01L 29/747* | (2006.01) | |
| *H01L 27/02* | (2006.01) | |

(52) U.S. Cl.
CPC .......... *H01L 27/0262* (2013.01); *H01L 29/747* (2013.01)
USPC .......... 257/124; 257/317; 257/320; 257/322; 257/355; 257/356; 257/173

(58) Field of Classification Search
USPC ......... 257/124, 317, 320, 322, 355, 356, 173, 257/E29.215; 361/56
See application file for complete search history.

(56) References Cited

U.S. PATENT DOCUMENTS

| | | | |
|---|---|---|---|
| 6,537,921 B2 | 3/2003 | Metzler | |
| 2002/0021538 A1 | 2/2002 | Chen et al. | |
| 2003/0035257 A1* | 2/2003 | Chen | 361/56 |
| 2007/0273429 A1* | 11/2007 | Ribeiro Duarte | 327/452 |
| 2009/0032838 A1 | 2/2009 | Tseng et al. | |
| 2010/0001347 A1 | 1/2010 | Sugiura | |
| 2013/0141824 A1* | 6/2013 | Bourgeat et al. | 361/56 |

FOREIGN PATENT DOCUMENTS

| | | |
|---|---|---|
| EP | 2246885 A1 | 11/2010 |
| WO | WO-2011089179 A1 | 7/2011 |

OTHER PUBLICATIONS

INPI Search Report and Written Opinion for FR1159951 mailed May 21, 2012 (6 pages).
Bourgeat J et al: "Evaluation of the ESD Performance of Local Protections Based on SCR or Bi-SCR With Dynamic or Static Trigger Circuit in 32nm," Microelectronics and Reliability, Elsevier Science Ltd, GB, vol. 50, No. 9-11, Sep. 1, 2010, pp. 1379-1382.

(Continued)

*Primary Examiner* — Matthew Reames
*Assistant Examiner* — Dilinh Nguyen
(74) *Attorney, Agent, or Firm* — Gardere Wynne Sewell LLP

(57) ABSTRACT

A protection device includes a triac and triggering units. Each triggering unit is formed by a MOS transistor configured to operate at least temporarily in a hybrid operating mode and a field-effect diode. The field-effect diode has a controlled gate that is connected to the gate of the MOS transistor.

15 Claims, 8 Drawing Sheets

(56) References Cited

OTHER PUBLICATIONS

Jang S-L et al: "Gate Coupled and Zener Diode Triggering Silicon-Controller Rectifiers for Electrostatic Discharge Protection Circuits," Solid State Electronics, Elsevier Science Publishers, Barking, GB, vol. 46, No. 2, Feb. 1, 2002, pp. 263-267.

Lim, W.L., et al: "Field-Effect Diode Based on Electron-Induced Mott Transition in $NdNiO_3$," Oct. 9, 2012, 5 pages.

Sheikhian, Iraj et al: "An Improved Differential Comparator With Field Effect Diode Output Stage," World Scientific, Journal of Circuits, Systems, and Computers, vol. 14, No. 5 (2005) 931-937.

Taghibakhsh, Farhad: "The Field Effect Diode," Bahonar University of Kerman, date unknown, pp. 236-237.

\* cited by examiner

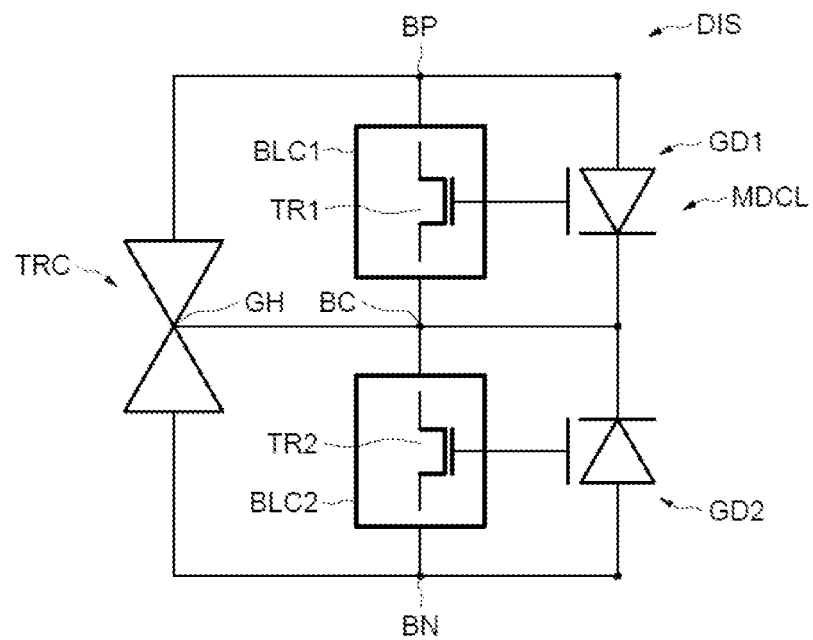
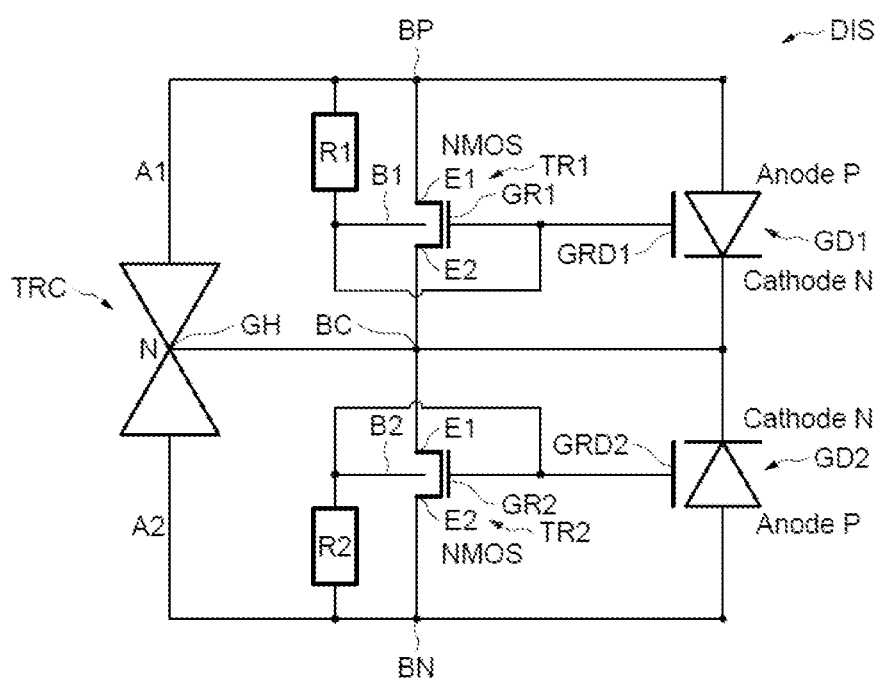

ELECTRONIC DEVICE FOR PROTECTING FROM ELECTROSTATIC DISCHARGE

PRIORITY CLAIM

This application claims priority from French Application for Patent No. 1159951 filed Nov. 3, 2011, the disclosure of which is hereby incorporated by reference.

TECHNICAL FIELD

The invention relates to electronic devices, and especially to those intended to protect components from electrostatic discharge (ESD), but also to "trigger" devices, as such devices are commonly called by those skilled in the art, capable of delivering a voltage intended, for example, to control another system.

BACKGROUND

The use of advanced CMOS technologies, for example the use of 65 nanometer or sub-65 nanometer technologies, and in particular 45 or 32 nanometer technologies, leads to lower and lower supply voltages being used.

An electronic device for protecting from electrostatic discharge comprising a triac and triggering means employing MOS transistors capable, in the presence of a current pulse, resulting for example from an electrostatic discharge, of operating in a hybrid mode including MOS-type operation in a sub-threshold mode and operation of the parasitic bipolar transistor, is described in published International Patent Application No. PCT/EP2011/050740 (WO 2011/089179), the disclosure of which is incorporated by reference.

The hybrid operating regime of a MOS transistor was demonstrated in the article by Galy, et al., "Ideal Gummel curves simulation of high current gain vertical NPN BIMOS transistor", Int. J. Electronics, 1996, Vol. 80 No. 6, 717-726, the disclosure of which is incorporated by reference. This article is a theoretical study carried out on a transistor with a vertical structure having a gate length (channel length) of about a micron and validated by simulations, without any application whatsoever of such hybrid operation being mentioned.

A four-terminal microelectronic component combining the bipolar effect and the MOS effect in a hybrid operating mode, in order to improve current gain, has also been described in French Patent Application No. 2,784,503, the disclosure of which is incorporated by reference. Such a component is presented as being able to withstand ionizing radiation and it is specified, in a general way, that it may be employed in mass-market, aerospace and/or military applications in the digital and analog fields without any application whatsoever of the hybrid operation of the component being mentioned.

The aforementioned published International Patent Application No. PCT/EP2011/050740 teaches that it is particularly beneficial to use this hybrid transistor operating regime especially to produce a device subjected to current pulses, in particular a device for protecting a component from electrostatic discharge, which discharge results in a current pulse between two terminals of the device, the current pulse being caused by a pulsed voltage difference between these two terminals.

This hybrid operation is obtained when the transistor is configured so that the gate of the MOS transistor is biased with a voltage lower than its threshold voltage and when the voltage difference between the substrate and the source of the MOS transistor is positive. This positive voltage difference is for example obtained when the substrate of the MOS transistor, which forms the intrinsic base of the parasitic bipolar transistor, is biased with a non-zero voltage whereas the source of the MOS transistor is grounded.

Provided that the transistor configuration conditions required to obtain this hybrid operation are met, the latter may be observed for relatively large gate lengths, for example 1 micron, though, in this case, the hybrid operation is not particularly applicable industrially.

In contrast, with technology scaling, the base of the parasitic bipolar transistor becomes smaller, particularly for 65 nanometer or sub-nanometer technologies and even more particularly for sub-50 nanometer technologies, for example 45 nanometer and 32 nanometer technologies, making the parasitic bipolar behavior of the MOS transistor more important.

Significant sub-threshold-voltage operation of the MOS transistor and simultaneous operation of the parasitic bipolar transistor then becomes possible, at least temporarily at the start of the current pulse.

Furthermore, with such hybrid operation, the current gain of the bipolar transistor, controlled by the gate voltage of the MOS transistor, may become substantial, even reaching a value as high as twenty or more.

Thus, this hybrid operation allows such a device to be advantageously used as an effective means for triggering a triac providing protection from electrostatic discharge, thereby significantly reducing the triggering threshold of the triac from about 8 volts to about 5 volts.

SUMMARY

According to one embodiment, an even more effective means for triggering a triac in the presence of an ESD pulse, in particular a slow ESD pulse, typically having a current-peak rise time of about 10 ns, is provided.

According to one embodiment, an additional gate-controlled triggerable element, for example a field-effect diode, also known, by those skilled in the art, as a "gated diode", is added, the gate of this diode being connected to the gate of a MOS transistor configured to operate at least temporarily in a hybrid operating mode.

According to one particular aspect, a device is provided for protecting from electrostatic discharge, the device comprising a triggerable element, for example a triac, connected between a first terminal and a second terminal, the first and second terminals being intended to be connected to a component to be protected The device also comprises means for triggering the triggerable element, said means being connected to an electrode for triggering the triggerable element, for example a trigger of the triac, the triggering means comprising a first unit and a second unit symmetrically connected in series between the first terminal and the second terminal, the terminal common to the two units being connected to said triggering electrode. Each unit comprises at least one MOS transistor including a parasitic transistor and configured, in the presence of a current pulse between the two terminals, to operate, at least temporarily, in a hybrid mode including MOS-type operation in a sub-threshold mode and operation of the bipolar transistor.

According to a general feature of this particular aspect, the triggering means furthermore comprise at least one first field-effect diode forward connected between the first terminal and said common terminal and the gate of which is connected to the gate of said at least one MOS transistor of the first unit and at least one second field-effect diode forward connected between the second terminal and said common terminal and the gate of which is connected to the gate of said at least one MOS transistor of the second unit.

It will be noted here that each field-effect diode is here configured in a totally novel way relative to the conventional configuration of a field-effect diode in which configuration the gate is directly connected either to the anode or cathode.

Thus, such a device has the advantage of being symmetrical and reversible with respect to the ESD pulse direction and the presence of the field-effect diodes enables more effective triggering of the triac in the presence of an ESD pulse, in particular in the presence of a slow ESD pulse, while providing better control of the sensitivity of the device as regards untimely triggering of the triac in the steady state.

In this respect, the inventors have observed that the ratio of the gate width of the field-effect diode to the gate width of the MOS transistor to which it is connected allows the sensitivity of the triac trigger to be adjusted.

An acceptable compromise between good ESD-pulse trigger sensitivity and low untimely-triggering risk is achieved when the gate width of the MOS transistor and the gate width of the field-effect diode are identical.

The two units preferably have one and the same structure but this structure may take different forms, especially certain of those described in the aforementioned published International Patent Application No. PCT/EP2011/050740.

Thus, it is possible for the substrate and the gate of the MOS transistor to be allowed to float, or else for them to be connected together without the gate and without the substrate being directly connected to the corresponding terminal (first or second depending on the unit). Two nodes are said to be "directly connected" or "directly coupled" when these two nodes are connected or coupled without an intermediate component being connected or coupled between them.

This is because, in this case, the bias that needs to be applied to the gate and substrate in order to obtain hybrid operation is provided by the current pulse via the drain-substrate and drain-gate capacitances.

More precisely, for submicron CMOS technologies, for example 250 nanometer technology, and even more significantly for sub-65 nanometer technologies, for example 45 nanometer technology, a MOS transistor with a floating substrate and gate or indeed a substrate and gate that are connected together without the gate and without the substrate being directly connected to the corresponding terminal, will pass, at least temporarily, into its hybrid operating mode in the presence of a current pulse resulting from an electrostatic discharge.

These embodiments are in particular, but not exclusively, applicable to transistors having thick gate oxides, for example gate oxides about 50 Angstroms in thickness.

This being so, such embodiments have, even in the presence of field-effect diodes, a low triggering voltage, which may be inappropriate for certain applications. This is because, even if the device provides effective ESD protection, it may trigger more easily in the presence of an accidental current spike during operation of the component to be protected, powered between a voltage Vdd and ground for example, i.e. in the steady state.

This triggering threshold may then advantageously be controlled by a control circuit, for example comprising at least one resistor, which will contribute to controlling the value of the voltage applied to the substrate and/or gate of the transistor.

More precisely, according to another embodiment, it is furthermore also possible for each unit to comprise a control circuit configured, in the presence of a current pulse between the two terminals, to apply a first non-zero voltage to the substrate of the MOS transistor and a second voltage, lower than the threshold voltage, to the gate of the MOS transistor.

This control circuit is advantageously configured to apply a first voltage that is lower than a voltage limit corresponding to a source-substrate saturation voltage of the parasitic bipolar transistor.

Here again, the control circuit may be produced in various ways.

Thus, according to another embodiment, the first unit comprises a first MOS transistor having its first electrode coupled to the first terminal, its second electrode coupled to said common terminal, its gate coupled to its substrate without being directly coupled to the first terminal, and a first resistive element coupled between the substrate of the first MOS transistor and the first terminal, and the second unit comprises a second MOS transistor having its first electrode coupled to said common terminal, its second electrode coupled to said second terminal, its gate coupled to its substrate without being directly coupled to the second terminal, and a second resistive element coupled between the substrate of the second MOS transistor and the second terminal.

Such a structure allows the bipolar and MOS effects to be simultaneously combined and amplified while reducing leakage currents.

Moreover, with such a transistor configuration, the latter will pass, in the presence of an electrostatic discharge applied between the two terminals of the device, at least temporarily at the start of the electrostatic discharge, into its hybrid operating mode because the biases on the substrate and the gate at least temporarily meet the conditions for obtaining hybrid operation.

This being so, even if this hybrid operation is observed with such a configuration for one-micron technologies (gate length of 1 micron), it becomes increasingly more significantly beneficial, especially for ESD protection applications, as the gate length decreases. Thus, such ESD protection devices have been produced in 250 nanometer technologies. These ESD protection devices have proved, moreover, to be particularly suited to advanced technologies, such as for example 65 nanometer technologies and sub-65 nanometer technologies, in particular 32 nanometer technology.

According to one embodiment, the triac comprises two fingers integrally produced respectively in semiconductor wells, and the two units and the corresponding field-effect diodes are integrally produced respectively on and in said semiconductor wells, the gates of the MOS transistors and the diodes advantageously being placed parallel to one another and on either side of each finger.

According to another aspect, an input/output cell is provided for an integrated circuit, comprising an input/output pad, a first supply terminal, a second supply terminal, a first ESD protection device as described above coupled between the first supply terminal and the input/output pad, a second ESD protection device as described above coupled between the input/output pad and the second supply terminal, and a third ESD protection device as described above coupled between the first supply terminal and the second supply terminal.

According to another aspect, an integrated circuit is provided comprising at least one input/output cell such as defined above.

BRIEF DESCRIPTION OF THE DRAWINGS

Other advantages and features of the invention will become clear on examining the detailed non-limiting description of methods of implementation and embodiments, and the appended drawings, in which:

FIGS. 2 to 7 schematically illustrate various embodiments;

DETAILED DESCRIPTION OF THE DRAWINGS

Figure 1:
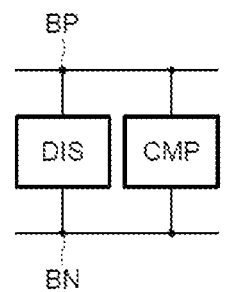
FIG. 1 shows a very schematic illustration of an embodiment of an electronic device, which device may be used to protect a component from electrostatic discharge.

In FIG. 1, the reference DIS denotes an electronic device forming, in this embodiment, a device for protecting an electronic component CMP from electrostatic discharge (ESD). The component CMP is connected to a first terminal BP and to a second terminal BN of the device DIS.

By way of indication, when the component CMP is operating, the terminal BP may be connected to a positive voltage Vp and the terminal BN may be connected to a negative or zero (ground) voltage Vn.

When the component CMP is not operating, it may be subjected to an electrostatic discharge typically taking the form of a very brief current pulse (typically a few microseconds in length) having a peak current of about 2 amps, for example, typically reached after 10 nanoseconds. Typically this corresponds, for example, to an applied pulsed voltage difference across the terminals BP and BN, generated via an equivalent RLC circuit, the peak voltage of which is reached after 10 nanoseconds with an HBM voltage of 1 to 4 kilovolts, for example, 4 kilovolts HBM for 2.5 amps.

It is recalled here that HBM is the acronym of the expression "human body model" well known to those skilled in the art in the field of electrostatic discharge protection and that HBM especially denotes an electrical circuit intended to model an electrostatic discharge delivered by a human being and commonly used to test the sensitivity of devices to electrostatic discharge. This HBM electrical circuit, which is the equivalent RLC circuit mentioned above, and to which a high voltage is applied, especially comprises a 100 picofarad capacitor that discharges through a 1.5 kilo-ohm resistor into the device to be tested. Thus, in the present case, an electrostatic discharge of 4 kilovolts HBM is understood to mean that a potential difference of 4 kilovolts is applied to the HBM electrical circuit.

This current pulse should then flow through the device DIS and not through the component CMP to be protected.

The device DIS therefore aims to absorb this current pulse and to prevent overvoltages across the terminals of the component CMP.

Figure 2:
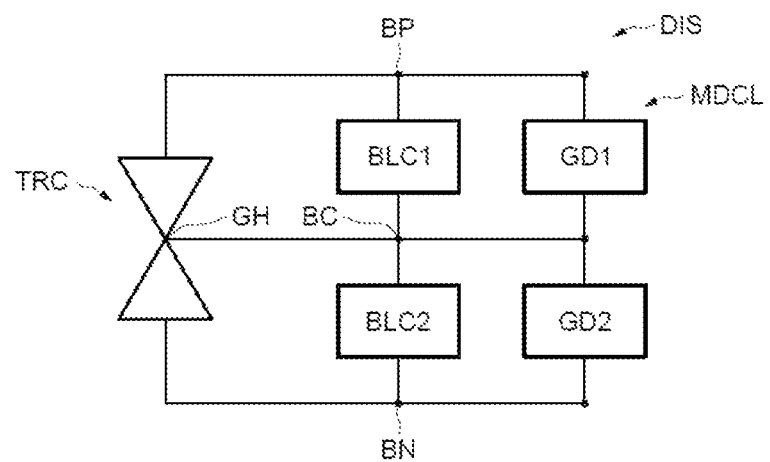

In the case where relatively high currents must be absorbed by the protection device DIS, it is particularly advantageous, as illustrated in FIGS. 2 and 3 for the latter to comprise a power component, for example a triac TRC connected between the two terminals BP and BN of the device and, for example, possessing a single trigger GH.

The device also comprises means MDCL for triggering the triac connected to the trigger of the triac.

The triggering means here comprise a first unit BLC1 and a second unit BLC2 symmetrically connected in series between the first terminal BP and the second terminal BN, the terminal BC common to both units being connected to said trigger GH.

As will be explained in more detail below, each unit BLC1, BLC2 comprises at least one MOS transistor TR1, TR2, including a parasitic transistor and configured, in the presence of a current pulse between the two terminals, to operate at least temporarily in a hybrid mode including MOS-type operation in a sub-threshold mode and operation of the bipolar transistor.

The triggering means furthermore comprise an additional triggering element associated with each unit, possessing a controllable gate. The additional triggering elements, respectively associated with the two units, are symmetrically connected between the terminals BP and BN, and their common node is connected to said common terminal BC and therefore to the trigger GH of the triac.

The control electrode of each additional triggering element associated with a unit is connected to the gate or control electrode of the MOS transistor of said unit.

Each additional triggering element is here configured in order to have a first state in which it is forward biased in the direction of the common node and a second state in which it is forward biased in the opposite direction, when there is a bias on its gate.

In the example described here, each additional triggering element is a field-effect diode.

More precisely, at least one first field-effect diode GD1 is forward connected between the first terminal BP and said common terminal and its gate is connected to the gate of said at least one MOS transistor TR1 of the first unit BLC1, and at least one second field-effect diode GD2 is forward connected between the second terminal BN and said common terminal and its gate is connected to the gate of said at least one MOS transistor TR2 of the second unit BLC2.

In the embodiment in FIG. 4, the first unit BLC1, comprises an nMOS transistor TR1 the first electrode E1 of which is connected to the terminal BP and the gate GR1 of which is connected to the substrate B1 (also known, by those skilled in the art, as the "bulk") of the transistor without being directly connected to the terminal BP.

Moreover, a resistor R1 is connected between the substrate B1 of the transistor TR1 and the terminal BP.

The gate GR1 is therefore connected to the terminal BP only via the resistor R1.

Analogously, the unit BLC2 comprises an nMOS transistor TR2 the second electrode E2 of which is connected to the second terminal BN and the first electrode E1 of which is connected to the second electrode E2 of the transistor TR1 of the first unit BLC1.

Moreover, the gate GR2 of the transistor TR2 is connected to its substrate B2 without being directly connected to the terminal BN.

Furthermore, a resistor R2 is connected between the substrate B2 and the terminal BN.

The gate GR2 is therefore connected to the terminal BN only via the resistor R2.

The second electrode E2 of the transistor TR1 and the first electrode E1 of the transistor TR2 form the common terminal BC.

This device has a configuration that is reversible with respect to the polarity of an electrostatic discharge.

Thus, in the presence of a high potential on the terminal BP and a low potential on the terminal BN, i.e. corresponding to a current pulse delivered from the terminal BP to the terminal BN, the electrode E1 of the transistor TR1 is its drain whereas the electrode E2 of the transistor TR1 is its source.

Moreover, the electrode E1 of the transistor TR2 is its drain and the electrode E2 of the transistor TR2 is its source.

In the case of an electrostatic discharge of reverse polarity, i.e. with a high potential on the terminal BN and a low potential on the terminal BP, the second electrodes E2 of the transistors TR1 and TR2 form the drains of these transistors, whereas the first electrodes E1 of these transistors form their sources.

Each transistor TRi includes a parasitic bipolar transistor the collector of which corresponds to the drain D of the nMOS transistor, the emitter of which corresponds to the source S of the MOS transistor, and the base of which corresponds to the substrate B of the nMOS transistor.

Each transistor TRi is here configured, in the presence of a current pulse between the two terminals BP and BN, to operate at least temporarily in a hybrid mode that includes MOS-type operation in a sub-threshold mode and operation of the parasitic bipolar transistor.

In this hybrid mode, the gate-source voltage $V_{GS}$ of the MOS transistor remains below the voltage threshold VT of the transistor, whereas a non-zero voltage $V_{BS}$ is applied between the substrate B and the source S of the transistor TRi in order to activate the parasitic bipolar transistor.

This being so, a voltage lower than a voltage limit is preferably applied to the substrate B of the transistor TRi in order to prevent saturation of the parasitic bipolar transistor. By way of indication, this voltage limit is here about 0.7 volts.

Thus, by applying a voltage to the substrate B of the transistor TRi, the parasitic bipolar transistor is activated and the current gain β of this parasitic bipolar transistor is controlled via the voltage applied to the gate of the transistor TR.

In the presence of a positive electrostatic discharge, i.e. causing a positive potential difference between the terminal BP and the terminal BN (resulting in a current pulse delivered from the terminal BP to the terminal BN), current flows, at the start of the pulse, through the resistor R1 and, when the voltage exceeds the threshold voltage of the diode (about 0.6 volts), through the forward-biased diode at the substrate-source junction (electrode E2) of the transistor TR1.

It should also be noted that, at least temporarily at the start of the pulse, the transistor TR1 passes into a hybrid operating mode especially because of the connection between the substrate B1 and the gate GR1.

Moreover, the field-effect diode GD1 is forward biased whatever the bias on its gate GRD1.

The current pulse is therefore transmitted to the common terminal BC via the transistor TR1 and the field-effect diode GD1.

Thus, the transistor TR2 passes, at least temporarily at the start of the pulse, into its hybrid operating mode.

This is because the electrostatic discharge is transmitted by way of the drain-substrate capacitance $C_{DB}$ of the substrate of the transistor TR2 and by the drain-gate capacitance $C_{DG}$ of the gate G of the transistor TR2.

The current pulse is converted by the resistor R2 into a substrate-source voltage $V_{BS}$ and into a gate-source voltage $V_{GS}$.

The presence of the capacitance $C_{DB}$, which is very high relative to the capacitance $C_{DG}$, and the connection between the substrate and the gate of the transistor TR2, allows the bipolar and MOS effects to be combined and amplified. This is because, since the capacitance $C_{DB}$ is very high relative to the capacitance $C_{DG}$, the pulse transmitted to the gate is smaller than that transmitted to the substrate. The presence of the connection between the gate and the substrate allows the gate to be more highly biased (by way of the pulse transmitted via the capacitance $C_{DG}$ and by way of the pulse transmitted through the substrate) and therefore these combined effects to be amplified, because the closer the gate voltage gets to the threshold voltage of the MOS transistor, the greater the increase in the current gain.

Moreover, the greater the product of R2 and $C_{DB}$, the lower the triggering voltage or threshold of the protection device.

Thus, depending on the technology used, the resistance of R2 will in particular be chosen so that the triggering threshold is acceptable and compatible with sub-threshold operation of the MOS transistor.

By way of indication, for a 40 nanometer technology (40 nanometer gate length) the capacitance $C_{DB}$ equals $1\times10^{-10}$ F/m and the capacitance $C_{DG}$ equals $1\times10^{-13}$ F/m.

For example R2 will be chosen to have a resistance of between 100 ohms and 100 kilo-ohms, for example 500 ohms.

Of course, if the gate-source voltage of the transistor TR2 exceeds the threshold voltage of the MOS transistor, the latter passes into a MOS-type operating mode.

Moreover, when the potential on the gate GR2 of the transistor TR2 increases, the potential on the gate GRD2 of the field-effect diode GD2 also increases, thereby creating an inversion channel in the diode GD2.

Thus, the field-effect diode GD1 contributes to transmitting the current pulse to the common terminal BC, and this common terminal BC, and therefore the trigger of the triac, are pulled to ground potential both by the transistor TR2 and by the field-effect diode GD2, thereby increasing the effectiveness of the triggering of the triac in the presence of an ESD pulse.

In the steady state, i.e. when the component to be protected is operating, with for example a supply voltage Vdd on terminal BP and terminal BN grounded, the resistor R1 and the substrate-source junction of the transistor TR1 allow the potential of the common terminal BC to be pulled higher. Moreover, the substrate-drain junction of the transistor TR2 is reverse-biased when the potential of the substrate B2 of the transistor TR2 is pulled toward ground potential via the resistor R2. Thus, the gate GR2 is also pulled toward ground potential. The transistor TR2 is therefore turned off, likewise the field-effect diode GD2. The device DIS is therefore not triggered in the steady state.

Of course, the reaction to a positive electrostatic discharge described above is identical for a negative electrostatic discharge, the roles of the transistors TR1 and TR2 being reversed and likewise the roles of the resistors R1 and R2 and the field-effect diodes GD1 and GD2.

Additionally, in the steady state, this time it is the resistor R2 and the substrate-source junction of the transistor TR2 that hold the node BC at a high (absolute value) voltage, thus turning the transistor TR1 and the field-effect diode GD1 off.

The gate width of each field-effect diode allows the sensitivity of the device to be adjusted with respect to triggering during an ESD pulse and with respect to untimely triggering in the steady state.

More precisely, the narrower the gate of the field-effect diode is made, the more effective the device becomes at protecting from ESD pulses, in particular slow ESD pulses, but the more prone the device is to untimely triggering in the steady state, and therefore it is less effective in this respect.

On the contrary, the wider the gate of the field-effect diode, the less effective the device becomes at protecting from ESD pulses, in particular slow ESD pulses, but the less prone the device is to untimely triggering in the steady state, and therefore it is more effective in this respect.

An acceptable compromise is reached by making the gate widths of the transistors TRi and the field-effect diodes GDi identical.

Figure 5:
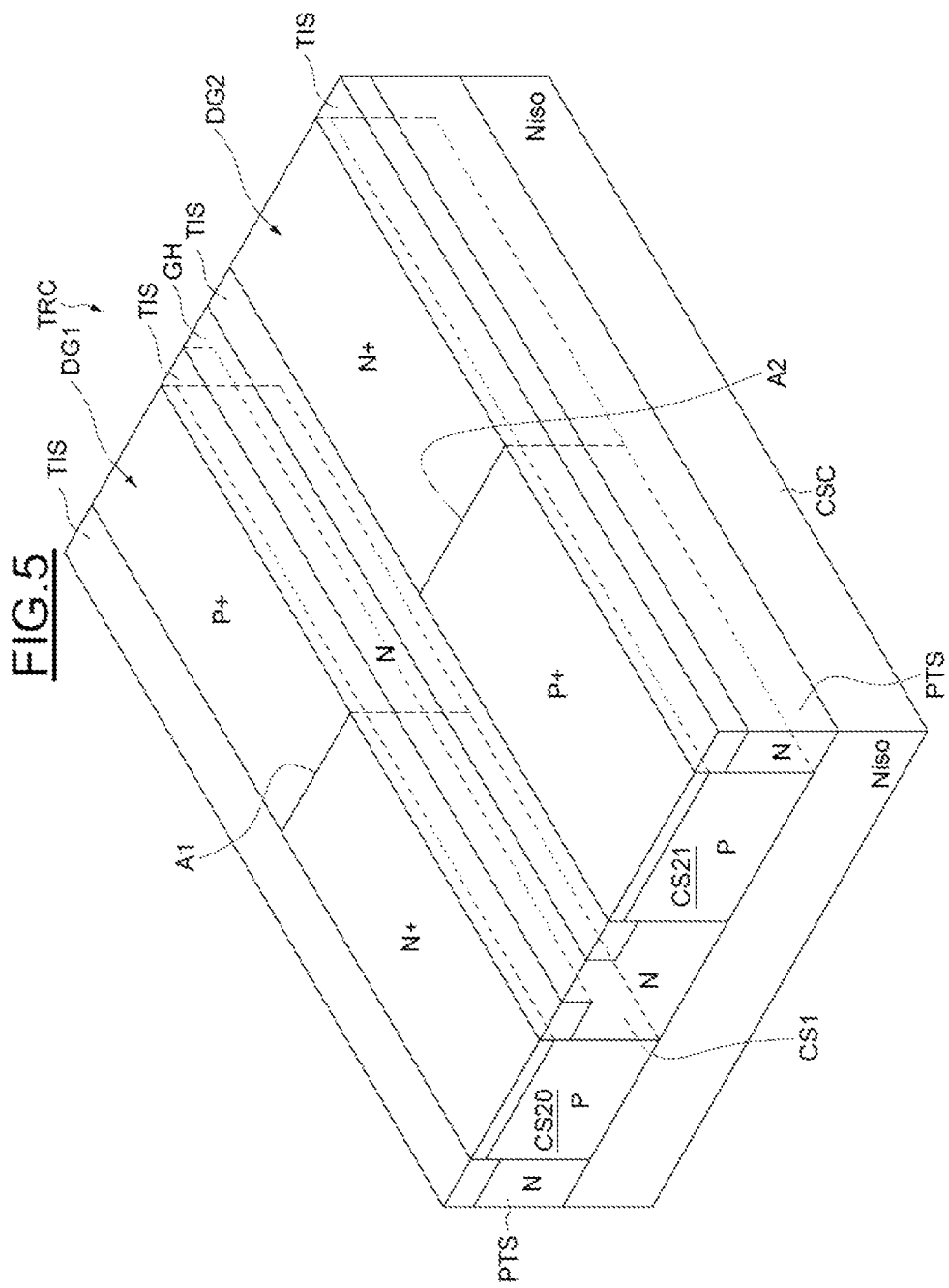

Although it is possible to use any type of triac, it is particularly advantageous, especially in terms of footprint, to use a triac with a single trigger, such as that illustrated in FIG. 5.

More precisely, in this example, the triac TRC with a single trigger GH comprises a first semiconductor well CS1 having a first conductivity type, for example n-type conductivity, forming the trigger GH of the triac, and two second semiconductor wells CS20 and CS21 having a second conductivity type of the opposite type to the first, here p-type conductivity. These two wells CS20 and CS21 are placed on either side of the first well CS1.

Moreover, an $n^+$-doped zone and a $p^+$-doped zone, located in mutual contact, both make contact with the well CS20 and form the electrode A1 of the triac TRC.

Likewise, a $p^+$-doped zone and an $n^+$-doped zone, located in mutual contact, both make contact with the second well CS21 and form the second electrode A2 of the triac TRC.

The $p^+$-doped and $n^+$-doped zones are isolated from the first well CS1 by shallow trench isolation TIS.

Likewise, trench isolation TIS isolates the external sides of the $n^+$-doped and $p^+$-doped zones of the triac TRC.

Each pair of mutually facing ($n^+$-, $p^+$-) zones separated by the well CS1 forms, with the subjacent p-type and n-type layers, a half-triac (thyristor).

Moreover, a buried semiconductor layer CSC (n-doped and commonly called a "NISO layer") makes contact with the first and second wells of the triac TRC. Regions PTS, doped n-type, are placed laterally with respect to the wells CS20 and CS21 and make in contact with the buried layer CSC.

The triac, which is a double p-n-p-n structure, therefore comprises here two fingers DG1, DG2 respectively integrated into the semiconductor wells mentioned above.

Figure 6:
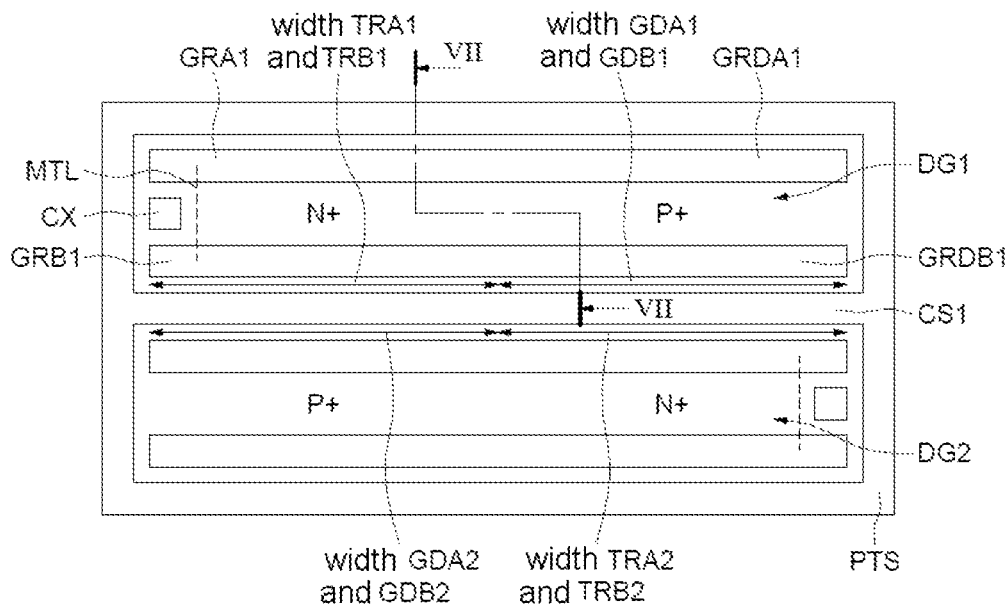
Figure 7:
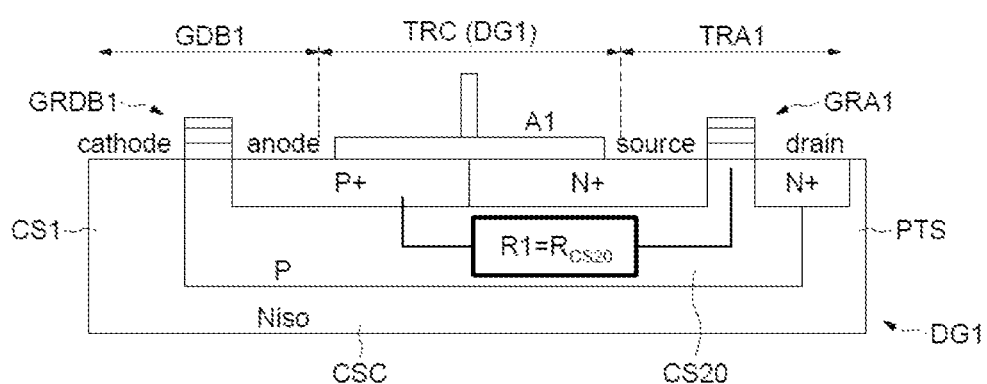

FIG. 6 and FIG. 7, which is a simplified cross section along the line VII-VII in FIG. 6, schematically illustrates an embodiment of the device DIS within an integrated circuit.

More precisely, FIG. 6 especially shows a simplified top view of a triac having a structure analogous to that in FIG. 5, each finger DGi of the triac here being surrounded by the (n-type) regions PTS and the buried (NISO) layer CSC.

The structure here advantageously allows for integration of the means for triggering the triac, i.e. the units BLC1 and BLC2 and the field-effect diodes GD1, GD2, on and into the semiconductor wells containing the fingers DG1 and DG2.

Additionally, in this particularly compact integrated embodiment, the mutually connected gates of the MOS transistors TRi and the corresponding field-effect diodes, respectively, lie parallel to the fingers.

In the example described here each MOS transistor TRi is formed by two parallel elementary MOS transistors TRAi, TRBi with their respective gates GRAi, GRBi connected.

Likewise, each field-effect diode GDi is formed by two elementary field-effect diodes GDAi, GDBi with their respective gates GRDAi, GRDBi connected.

Moreover, the gates of the elementary transistors and of the corresponding elementary diodes lie parallel to and on either side of a finger.

More precisely, a pair of polysilicon lines lie on the p-type well CS20 of the finger DG1, these polysilicon lines being connected via a metallization MTL (represented by the dotted line) to a higher metallization level. These polysilicon lines are isolated from the underlying p-type well by an oxide and they form the gates GRA1, GRB1, GRDA1, GRDB1 of the transistors TRA1, TRB1 and of the field-effect diodes GRDA1, GRDB1.

The transistors TRA1, TRB1 and the corresponding field-effect diodes GDA1, GDB1, are respectively formed in two zones of the finger DG1.

Moreover, the resistor R1 of the unit BLC1 is formed by the resistance of the p-type well CS20 lying between the substrate of the transistor and the anode ($p^+$-doped zone) of the part A1 of the triac.

Likewise, the gates of the transistors and of the field-effect diodes are connected to this resistor R1 by a connection CX in a $p^+$-doped region of the well CS20.

Finger DG2 has a structure analogous to that of finger DG1.

It is particularly advantageous to incorporate electrostatic discharge protection devices of the type described above in an input/output cell of an integrated circuit.

Figure 8:
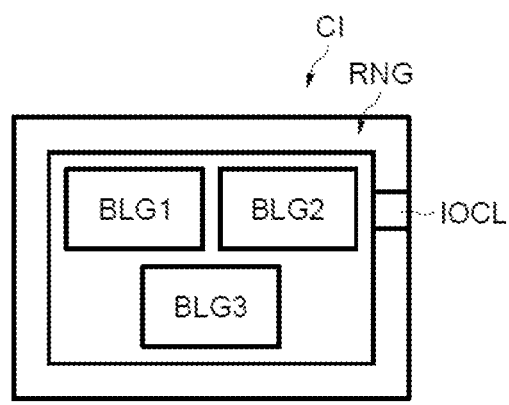
FIGS. 8 and 9 schematically illustrate an embodiment of an integrated circuit and an input/output cell of an integrated circuit according to the invention.

By way of non-limiting example, such input/output cells IOCL may be placed, as illustrated in FIG. 8, in a ring RNG on the periphery of the integrated circuit CI.

These cells IOCL may for example be used to transmit supply voltages and/or data signals to and/or from the functional units BLG1-BLG3 of the integrated circuit.

Figure 9:
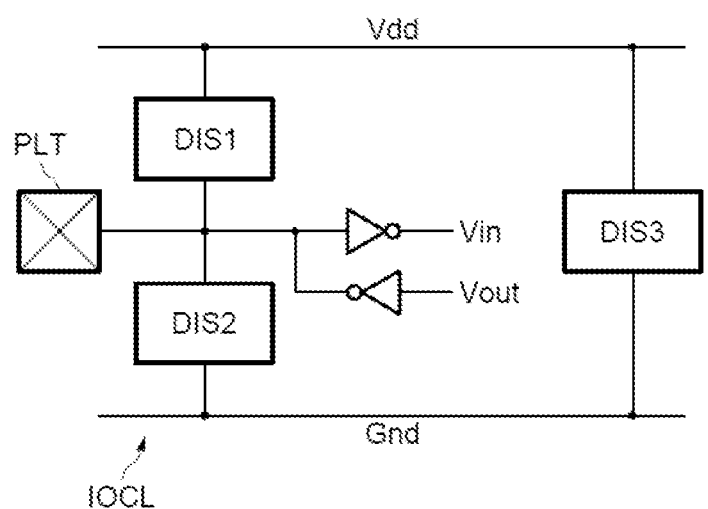

As illustrated in FIG. 9, the input/output cell for example comprises an input/output pad PLT for receiving/transmitting a signal. This cell comprises two supply terminals Vdd and Gnd. A first device DIS1 of the type described above is then placed between the supply terminal Vdd and the input/output pad PLT.

A second protection element DIS2 is placed between the input/output pad PL2 and the second supply terminal Gnd. Finally, a third ESD protection device DIS3 is placed between the two supply terminals Vdd and Gnd.

Thus, such an input/output cell is protected, in a way that is extremely simple, from electrostatic discharge between the two supply terminals Vdd and Gnd, and from any electrostatic discharge between the supply terminal Vdd and the input/output pad or between the input/output pad and the supply terminal Gnd. The functional units connected between the two terminals Vdd and Gnd are therefore also protected from electrostatic discharge.

The invention is not limited to the embodiments described above but includes any variant.

Thus the structure of each unit BLCi may be different provided that the structure employed allows the corresponding MOS transistor to at least temporarily operate in its hybrid mode in the presence of an ESD pulse and depending on the direction of the pulse.

Figure 10:
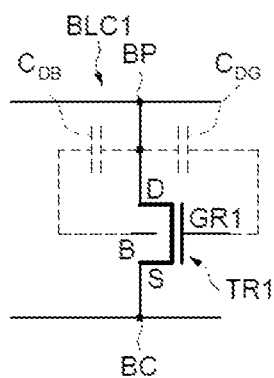
FIGS. 10 to 14 schematically illustrate yet more embodiments of a device.

More precisely, as illustrated in FIG. 10, the substrate and the gate of the MOS transistor may be allowed to float. The bipolar-and-MOS effect is then obtained by capacitive coupling of the gate and substrate, via the capacitors $C_{DB}$ and $C_{DG}$. In FIG. 10, for the sake of simplicity, only the unit BLC1 has been shown and it has been assumed that the first electrode of the transistor TR1 is its drain D.

Figure 11:
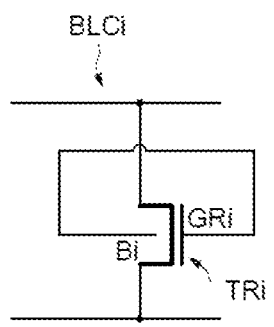

The gate GRi and the substrate Bi of the transistor TRi may furthermore be electrically connected, as illustrated in FIG. 11, in order to amplify the effect.

These embodiments are particularly advantageous for transistors TRi with thick gate oxides, typically about 50 Ångströms in thickness.

This being so, these embodiments have very low triggering thresholds because the resistance between the substrate and ground (absence of connection between the substrate and ground) and between the gate and ground (absence of connection between the gate and ground) is very high. A very low triggering threshold may be unsuitable for certain applications, in particular when the component to be protected injects current into another component, because this injection may lead to untimely triggering of the device DIS.

This is why it is preferable to use the embodiments described earlier with a resistor between the substrate and one of the terminals BP or BN. This is because adjusting the resistance of this resistor allows the value of the triggering threshold to be increased.

Figure 12:
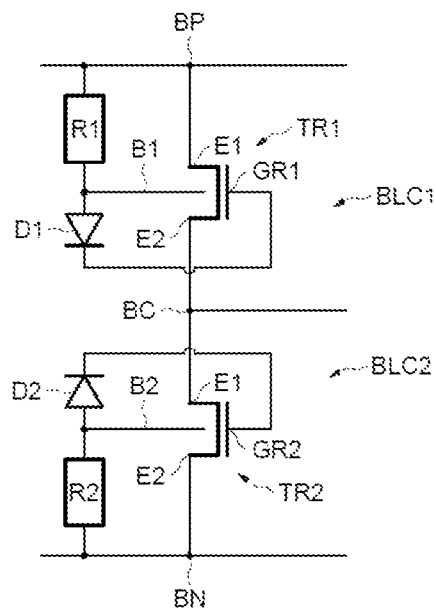

Another embodiment of the device DIS is illustrated in FIG. 12. In this figure, it may be seen that each unit BLC1, BLC2 comprises a diode D1, D2 connected between the gate and the substrate of the corresponding transistor.

More precisely, the cathode of the diode is connected to the gate of the corresponding transistor, whereas the anode is connected to the substrate of the transistor and also to the corresponding resistor R1 or R2.

This diode slows the discharge of the gate capacitance of the corresponding transistor after the ESD pulse has finished, thereby allowing the transistor TRi to remain turned on for longer, and thereby considerably decreasing any spike in residual voltage after the pulse has finished.

Figure 13:
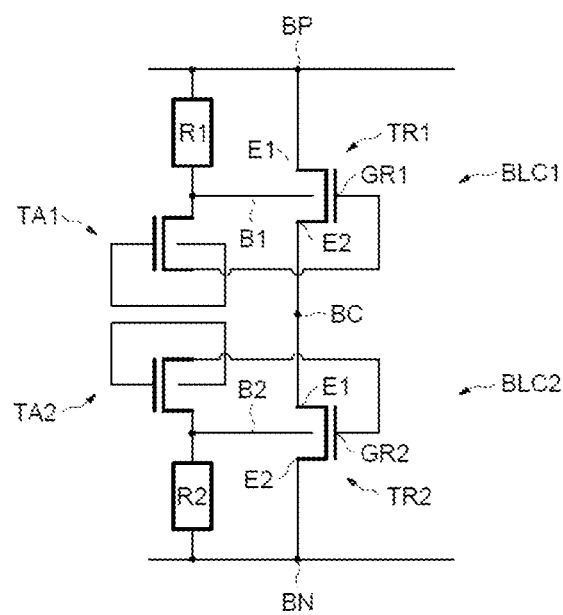

In FIG. 13, the diodes have been replaced by auxiliary transistors TA1, TA2. Each transistor TA1, TA2 is an nMOS transistor having its gate connected to its substrate and a first electrode connected to the gate of the corresponding transistor TR1, TR2, whereas the other electrode is connected to the corresponding resistor R1, R2.

Such an additional transistor will therefore, during an ESD pulse, amplify the hybrid operation of the corresponding transistor TR1, TR2 and, after the ESD pulse has finished, slow the discharge of the gate capacitance of the transistor TR1, TR2. In this embodiment, the amplification of the hybrid operation of the transistor TR1, TR2 is more rapid than in the embodiment in FIG. 12, because, in the embodiment in FIG. 12, the threshold voltage of the diode must be exceeded before the hybrid operation of the transistor TR1, TR2 can be amplified, whereas the presence of the additional transistors TA1, TA2, which themselves pass at least temporarily into their hybrid operating mode, allows the threshold-voltage constraint to be bypassed and more rapid amplification to be achieved.

Figure 14:
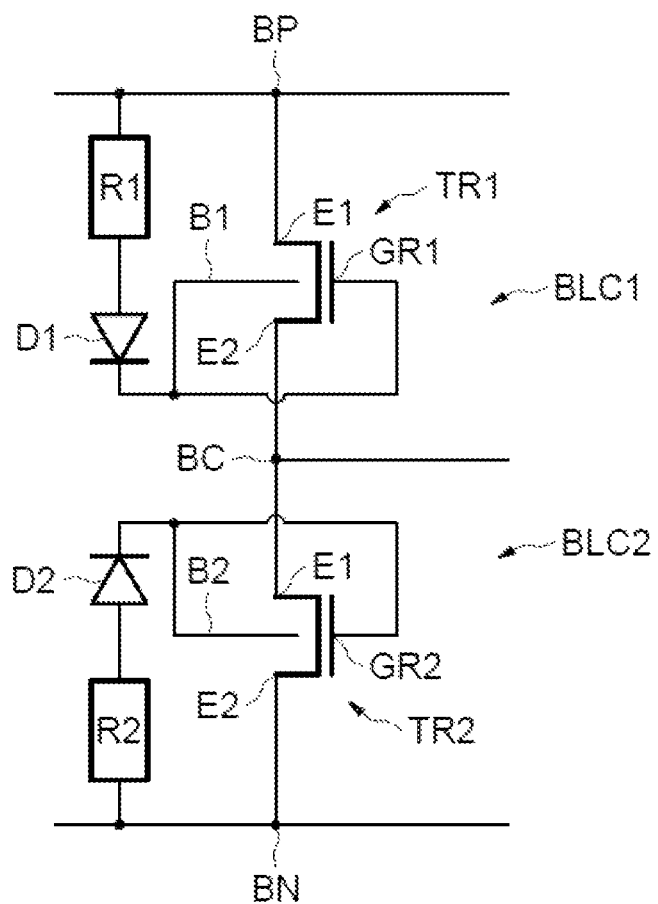

In the embodiment in FIG. 14, the additional element allowing the discharge of the gate capacitance to be slowed after the ESD pulse has finished, here a diode, is now connected between the substrate of the corresponding transistor and the corresponding resistor.

More precisely, in the unit BLC1, the cathode of the diode D1 is connected to the substrate of the transistor TR1 and the anode is connected to the resistor R1, whereas in the unit BLC2, the cathode of the diode D2 is connected to the substrate of the transistor TR2, and the anode to the resistor R2.

Moreover, each transistor TR1, TR2 has its substrate directly connected to its gate.

Because of the direct connection between the substrate and the gate, the hybrid operation of the corresponding transistor is amplified during an ESD pulse. Moreover, the diode again allows the discharge of the gate capacitance of the transistor to be slowed after the ESD pulse has finished. Furthermore, this capacitance will now discharge into the substrate of the transistor, thereby contributing to the hybrid operation of the transistor after the ESD pulse has finished and especially allowing a more rapid dissipation of the ESD discharge. In other words, in this embodiment, a combined MOS/bipolar effect is obtained for the transistor TR1, TR2 at the start of the ESD pulse and at the end of the ESD pulse.

Of course, as previously mentioned, although in the examples described above a number of nMOS transistors were used, the invention also applies to the use of a number of paired pMOS transistors, the direction of the diodes GD1 and GD2 remaining the same.

Moreover, the structure just described is applicable to any type of integrated technology, whether it is bulk-substrate technology or even a silicon-on-insulator (SOI) technology.

The invention is not limited to the embodiments described above but encompasses any variant.

Thus, even though using a field-effect diode as an additional triggering element is particularly advantageous, because on the one hand it is particularly easy and inexpensive in terms of footprint to integrate it into silicon, and on the other hand adjustment of its gate width allows the sensitivity of the device in terms of ESD protection and in terms of untimely triggering to be easily adjusted, other additional triggering elements can be envisaged, such as for example a thyristor, the trigger P of which would be connected to the gate of the MOS transistor of the corresponding unit or even another triac, a trigger of which would be connected to the gate of the MOS transistor of the corresponding unit. In such embodiments, the additional triggering elements (thyristor or triac) are triggered (turned on) when the gate voltage of the corresponding MOS transistor exceeds a certain threshold.

Another embodiment is possible.

Specifically, when field-effect diodes are used, it is possible to reverse their direction relative to that illustrated in FIGS. 3 and 4. More precisely, in this case it is the anodes of diodes GD1 and GD2 that are connected to the common terminal. Such an embodiment allows an additional static triggering element to be produced, which element supplements the dynamic triggering unit comprising the MOS transistor. In the presence of an ESD pulse delivered for example from the terminal BP to the terminal BN, the pulse is transmitted to the common terminal BC via the transistor TR1, via the p$^+$-n junction of the triac, and also via the inversion channel created in the diode GD1 when the potential on the gate of the transistor TR1 increases. Next, the trigger of the triac is pulled toward ground potential both by the transistor TR2 and by the diode GD2, which is forward connected between the common terminal BC and the terminal BN. This embodiment is particularly suited to low supply voltages because such a static trigger triggers at 2 times the threshold voltage of a diode, i.e. about 1.2 volts.

What is claimed is:

1. A device, comprising:
a triac element connected between a first terminal and a second terminal and having a trigger, and
a circuit configured to actuate the triac element through the trigger, said circuit comprising a first unit and a second unit symmetrically connected in series between the first terminal and the second terminal at a common terminal connected to said trigger,
each first and second unit comprising at least one MOS transistor including a parasitic bipolar transistor and configured, in the presence of a current pulse between the first and second terminals, to operate, at least temporarily, in a hybrid mode including MOS-type operation in a sub-threshold mode and operation of the parasitic bipolar transistor,
said circuit further comprising:
at least one first field-effect diode having an anode terminal, a cathode terminal and a gate terminal, wherein the anode terminal is connected to the first terminal and the cathode terminal is connected to said common terminal and the gate terminal is connected to a gate of said at least one MOS transistor of the first unit, and
at least one second field-effect diode having an anode terminal, a cathode terminal and a gate terminal, wherein the anode terminal is connected to the second terminal and the cathode terminal is connected to said common terminal and the gate terminal is connected to the gate of said at least one MOS transistor of the second unit.

2. The device according to claim 1, wherein said at least one first field-effect diode and said at least one MOS transistor of the first unit have mutually connected gates having a same width.

3. The device according to claim 1, wherein said at least one second field-effect diode and said at least one MOS transistor of the second unit have mutually connected gates having a same width.

4. The device according to claim 1, wherein the first unit comprises a first MOS transistor having a first electrode coupled to the first terminal, a second electrode coupled to said common terminal, a gate coupled to a bulk of the first MOS transistor without being directly coupled to the first terminal, and a first resistive element coupled between the bulk of the first MOS transistor and the first terminal.

5. The device according to claim 1, wherein the second unit comprises a second MOS transistor having a first electrode coupled to said common terminal, a second electrode coupled to said second terminal, a gate coupled to a bulk of the second MOS transistor without being directly coupled to the second terminal, and a second resistive element coupled between the bulk of the second MOS transistor and the second terminal.

6. The device according to claim 1, wherein the triac element comprises: two fingers integrally produced respectively in semiconductor wells, and wherein the first and second units and the corresponding first and second field-effect diodes are integrally produced respectively on and in said semiconductor wells.

7. The device according to claim 6, wherein respective, mutually connected control electrodes of the MOS transistors and the corresponding first and second field-effect diodes lie parallel to the fingers.

8. A device, comprising:
a triggerable element connected between a first terminal and a second terminal, and
a circuit configured to actuate the triggerable element, said circuit connected to a trigger of the triggerable element and comprising:
a first unit comprising a first MOS transistor having a first electrode coupled to the first terminal, a gate coupled to a substrate of the first MOS transistor without being directly coupled to the first terminal, and a first resistive element coupled between the substrate of the first MOS transistor and the first terminal,
a second unit comprising a second MOS transistor having a first electrode coupled to the second electrode of the first MOS transistor and to the trigger, a gate coupled to a substrate of the second MOS transistor without being directly coupled to the second terminal, a second electrode coupled to the second terminal, and a second resistive element coupled between the substrate of the second MOS transistor and the second terminal,
a first field-effect diode having an anode terminal, a cathode terminal and a gate terminal, wherein the anode terminal is coupled to the first terminal and the cathode terminal is coupled to the second electrode of the first MOS transistor and the gate terminal is coupled to the gate of the first MOS transistor, and
a second field-effect diode having an anode terminal, a cathode terminal and a gate terminal, wherein the anode terminal is coupled to the second terminal and the cathode terminal is coupled to the first electrode of the second MOS transistor and the gate terminal is coupled to the gate of the second MOS transistor.

9. The device according to claim 8, wherein respective mutually connected gates of the first or second MOS transistor and the corresponding first or second field-effect diode have the same width.

10. The device according to claim 8, wherein the triggerable element is a triac.

11. The device according to claim 10, wherein the triac comprises: two fingers integrally produced respectively in semiconductor wells, and wherein the first and second units and the corresponding first and second field-effect diodes are integrally produced respectively on and in said semiconductor wells.

12. The device according to claim 11, wherein respective, mutually connected gates of the MOS transistors and the corresponding first and second field-effect diodes lie parallel to the fingers.

13. The device according to claim 12, in which each MOS transistor is formed by two parallel elementary MOS transistors with their respective gates connected, and each field-effect diode is formed by two elementary field-effect diodes with their respective gates connected, and the gates of the elementary transistors and the gates of the corresponding elementary diodes lie parallel to one another and on either side of a finger.

14. The device according to claim 12, wherein a gate length of each MOS transistor is less than 1 micron.

15. A device, comprising:
a triac coupled between a first terminal and a second terminal,
a circuit configured to trigger the triac, said circuit comprising:
a first MOS transistor having a drain directly connected to the first terminal, a gate directly connected to a substrate of the first MOS transistor without connection to said first terminal, and a source directly connected to a trigger of the triac;
a first resistive element directly connected between the substrate and gate of the first MOS transistor and the first terminal;
a second MOS transistor having a drain directly connected to the source of the first MOS transistor and to the trigger, a gate directly connected to a substrate of the second MOS transistor without connection to said second terminal, and a source directly connected to the second terminal;
a second resistive element directly connected between the substrate and gate of the second MOS transistor and the second terminal;
a first field-effect diode having an anode terminal directly connected to the first terminal, a cathode terminal directly connected to the source of the first MOS transistor and a gate terminal directly connected to the gate of the first MOS transistor, and
a second field-effect diode having an anode terminal directly connected to the second terminal, a cathode terminal directly connected to the drain of the second MOS transistor and a gate terminal connected to the gate of the second MOS transistor.

* * * * *